United States Patent
Menegolo et al.

(10) Patent No.: US 10,622,904 B1
(45) Date of Patent: Apr. 14, 2020

(54) ISOLATED FEEDBACK TECHNIQUES FOR A FLYBACK VOLTAGE CONVERTER

(71) Applicant: Infineon Technologies AG, Neubiberg (DE)

(72) Inventors: Andrea Menegolo, Camisano Vicentino (IT); Philipp Brandtner, Ischgl (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/365,565

(22) Filed: Mar. 26, 2019

(51) Int. Cl.
*H02M 3/335* (2006.01)
*G01R 19/00* (2006.01)
*H02M 1/08* (2006.01)

(52) U.S. Cl.
CPC .... *H02M 3/33523* (2013.01); *G01R 19/0084* (2013.01); *H02M 1/08* (2013.01)

(58) Field of Classification Search
CPC ......... H02M 3/33507; H02M 3/33561; H02M 3/33569; H02M 3/33523
USPC ................................ 363/21.12, 21.13–21.18
See application file for complete search history.

(56) References Cited

U.S. PATENT DOCUMENTS

| | | | |
|---|---|---|---|
| 7,463,497 B2 | 12/2008 | Negrete | |
| 2014/0029316 A1* | 1/2014 | Adragna | H02M 3/33523 363/21.18 |
| 2015/0236602 A1* | 8/2015 | Ankamreddi | H02M 3/33523 363/21.18 |

OTHER PUBLICATIONS

Brandtner, "Concept, Realization and Characterization of Flyback DC/DC Converters with Isolated Feedback Network," Master Thesis submitted Jun. 25, 2018, 85 pp.
Contributing author to Electronic Design [Online], "LIN and CAN Networks Will Expand Automotive Distributed Intelligence," accessed from https://www.electronicdesign.com/displays/lin-and-can-networks-will-expand-automotive-distributed-intelligence published Jan. 22, 2001, 2 pp.
Corrigan, "Introduction to the Controller Area Network (CAN)," Texas Instruments, Application Report SLOA101B, Revised May 2016, 17 pp.
"What is Can Bus?" accessed from https://canbuskits.com/what.php accessed on or about Jan. 14, 2019, 4 pp.

* cited by examiner

*Primary Examiner* — Nguyen Tran
(74) *Attorney, Agent, or Firm* — Shumaker & Sieffert, P.A.

(57) ABSTRACT

The disclosure is directed to techniques to determine the output voltage on the secondary side of a power converter. These techniques maintain isolation between the primary and secondary by measuring a voltage on the primary side with a single sample event synchronized to a power cycle of the power converter. A measuring circuit may determine a drain voltage of a primary side switch that controls current to the primary side coil. The measuring circuit may sample the drain voltage at a predetermined delay time from a trigger pulse based on a control signal to the primary side switch. The output voltage may be calculated based on the sampled drain voltage and other characteristics of the flyback converter circuit, such as transformer turns ratio, primary side input voltage and other characteristics. The output voltage calculation does not require auxiliary windings or isolation components, such as an opto-coupler.

23 Claims, 11 Drawing Sheets

ISOLATED FEEDBACK TECHNIQUES FOR A FLYBACK VOLTAGE CONVERTER

TECHNICAL FIELD

The disclosure relates to DC-DC power converter circuits.

BACKGROUND

Systems that include power converters with isolated topologies may provide a safety benefit to prevent propagation of a high voltage to lower voltage circuits in the system. To maintain a desired output voltage and current on a secondary side of an isolated power converter, a controller on the primary side may benefit from receiving feedback about the behavior of the output power. For example, in a converter with flyback topology, the power path is naturally isolated because of the presence of a transformer that ensures the galvanic isolation. However, some examples of feedback networks may be non-isolated preventing the design of a fully isolated DC/DC converter. In some examples, feedback networks may introduce isolation components, such as optocouplers, which may increase complexity and cost and may impact reliability. Other example techniques for output power feedback may require additional windings on the primary side of the transformer, which may also increase cost and complexity.

SUMMARY

In general, the disclosure is directed to techniques to determine the output voltage on the secondary side of a flyback power converter by measuring a voltage on the primary side with a single sample event synchronized to a power cycle of the power converter. For example, a measuring circuit according to this disclosure may determine a drain voltage of a primary side switch that controls current to the primary side coil. The measuring circuit may sample and hold the drain voltage at a predetermined delay from a trigger pulse. The trigger pulse may be based on a control signal to the primary side switch. The output voltage may be calculated based on the sampled drain voltage and other characteristics of the flyback converter circuit, such as transformer turns ratio, primary side input voltage and other characteristics.

In one example, the disclosure is directed to a method comprising: determining a first off-transition time of a control signal for a primary side switch, wherein the primary side switch controls a current through a primary side coil of a power converter, and wherein at the off-transition time, the control signal controls the primary side switch to switch off the current through the primary side coil. The method further includes delaying, for a predetermined time delay, a sample trigger signal, wherein the predetermined time delay begins from the first off-transition time. In response to the sample trigger signal, triggering a voltage measurement circuit to measure a voltage at a node on the primary side of the power converter for a predetermined sampling time, wherein the node is located between the primary side switch and the primary side coil, inhibiting the voltage measurement circuit from taking further voltage measurements until a second off-transition time of the control signal, wherein the second off-transition time is subsequent to the first off-transition time, and calculating an output voltage at a secondary side coil of the power converter based on the measured voltage at the node.

In another example, the disclosure is directed to a voltage sensing circuit, the circuit comprising: a trigger detection unit, wherein the trigger detection unit is configured to detect a change in level of a control signal and output a detection signal approximately simultaneous with the change in level of the control signal, a voltage sampling unit operatively coupled to a primary side coil of an isolated power converter circuit and configured to measure a voltage of the primary side coil upon receiving a trigger signal, and a delay unit configured to receive the detection signal from the trigger detection unit and output the trigger signal to the voltage sampling unit after a predetermined time delay, wherein the voltage sensing circuit is configured to take one and only one voltage measurement sample for each detection signal.

In another example, the disclosure is directed to system comprising: an isolated power converter circuit comprising: a transformer with a primary side coil and a secondary side coil, a primary side switch, wherein the primary side switch is controlled by a control signal, configured to control the current through the primary side coil, and coupled to the primary side coil at a node. The power converter also comprises an output circuit, wherein the output circuit is operatively coupled to the secondary side coil and configured to condition output power from the isolated power converter circuit. The system further comprises a voltage sensing circuit, the voltage sensing circuit comprising: a trigger detection unit, wherein the trigger detection unit is configured to detect a change in level of the control signal and output a detection signal approximately simultaneous with the change in level of the control signal, a voltage sampling unit operatively coupled to the node and configured to measure a voltage of the node upon receiving a trigger signal, and a delay unit configured to receive the detection signal from the trigger detection unit and output the trigger signal to the voltage sampling unit after a predetermined time delay, wherein the voltage sensing circuit is configured to take one and only one voltage measurement sample for each detection signal.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques to determine the output voltage on the secondary side of a flyback power converter by measuring a voltage on the primary side with a single sample event synchronized to a power cycle of the power converter. A measuring circuit according to this disclosure may determine a drain voltage of a primary side switch that controls current to the primary side coil. The measuring circuit may sample and hold the drain voltage after a predetermined delay from a trigger pulse. The trigger pulse may be based on a control signal to the primary side switch. The output voltage may be calculated based on the sampled drain voltage and other characteristics of the flyback converter circuit, such as transformer turns ratio, primary side input voltage and other characteristics.

The techniques of this disclosure may be implemented in a variety of ways, described in detail below. The measuring circuit, delay, trigger detection and other aspects of this disclosure may be implemented with discrete components, an integrated circuit, logic circuitry, by using a processor executing programming instructions and other similar techniques. The length of the predetermined delay, the amount of sampling time for the single sampling event, and other parameters may be adjusted depending on the characteristics of the flyback power converter and tuned to give the most accurate determination of the output voltage. The output voltage determination may be sent to a flyback control circuit which may control the switching time, switching frequency and so on to maintain the output voltage at a desired level during operation to handle changes in a load demand on the power converter, changes in temperature and other changes.

In some examples the power converter that includes output voltage detection may convert a lower input voltage to a higher output voltage. In other examples the power converter may convert a higher input voltage to a lower output voltage. The techniques of this disclosure maintain the inherent galvanic isolation of the flyback power converter, which may help prevent the higher voltage from reaching lower voltage circuitry.

Figure 1:
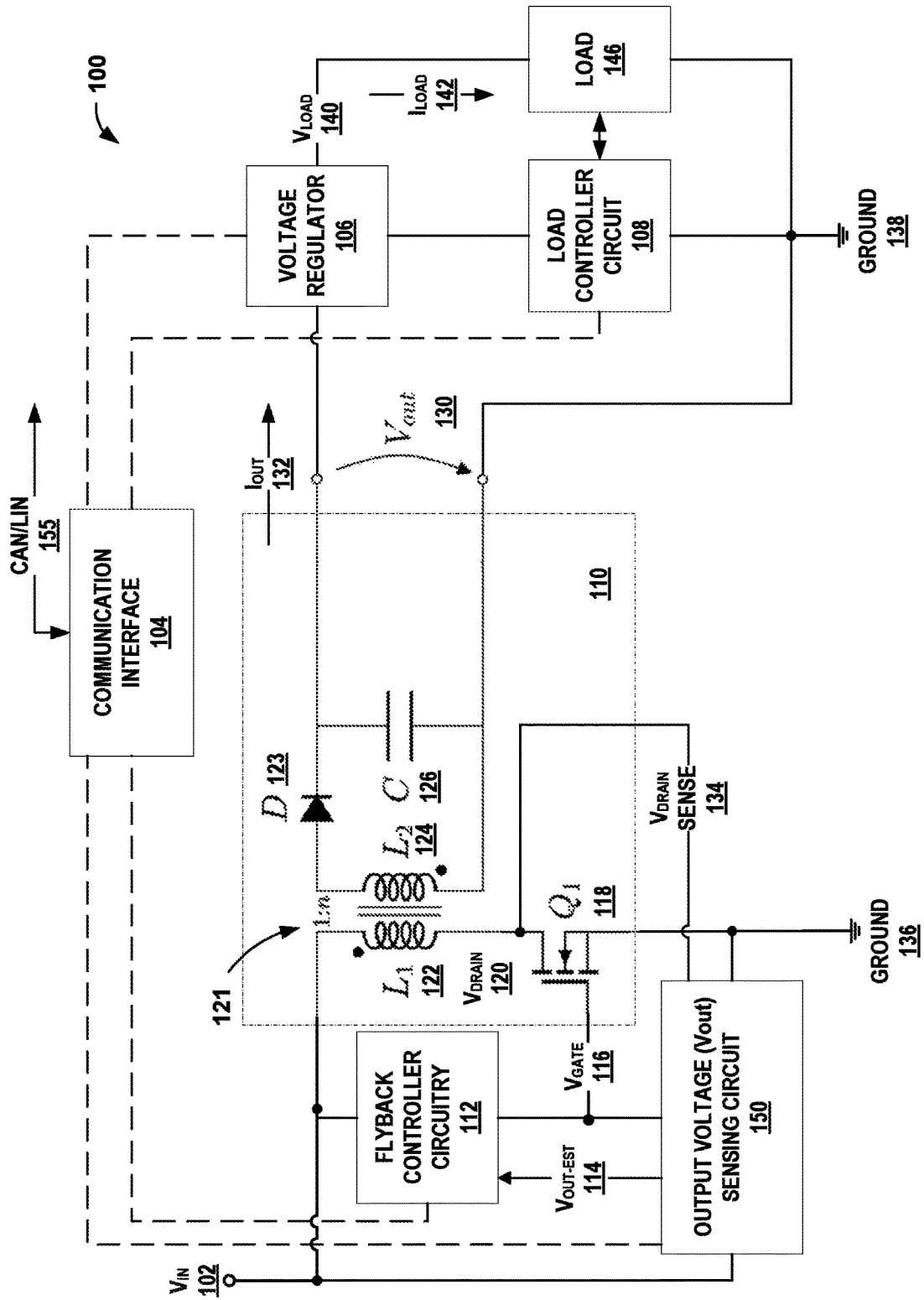
FIG. 1 is a block diagram illustrating an example system including a power converter circuit with an output voltage sensing circuit according to one or more techniques of this disclosure.

FIG. 1 is a block diagram illustrating an example system including a power converter circuit with an output voltage sensing circuit according to one or more techniques of this disclosure. The flyback power converter topology of system 100 is just one example of a flyback power converter that may include the voltage detection techniques of this disclosure. For example, the flyback power converter of system 100 includes diode rectification and an RC output network. In other examples, the flyback power converter may include synchronous rectification (SR). However, examples of SR that maintain the isolation between the primary side and the secondary side may be more desirable in conjunction with the techniques of this disclosure than other examples of SR.

System 100 includes flyback power converter 110, flyback controller circuitry 112, output voltage sensing circuit 150, voltage regulator 106, load 146 and load controller circuit 108 and communication interface 104. In the example of FIG. 1, the primary side has a separate ground 136 from the secondary side ground 138, though the grounds may connect to a common ground of a larger system. An example of system 100 may include a drive system for an electric vehicle motor in which the input voltage 102 on the primary side may be approximately 50 V and the output voltage Vout 130 may be approximately 12 V. In other examples, the input voltage may be less than the output voltage.

The example of system 100 depicts the various components of the power converter, e.g. flyback 110, Vout sensing circuit 150, flyback controller circuitry 112 as separate components. However, this depiction is for illustration only. In other examples flyback controller circuit 112, Vout sensing circuit 150, and other components may be implemented as a single unit, such as an integrated circuit or as an integrated circuit with one or more external components.

Flyback power converter 110 (also referred to as flyback 110 in this disclosure) is an isolated power converter circuit that includes transformer 121 with primary side coil 122 and secondary side coil 124. In the example of FIG. 1, the inductance of primary side coil 122 is $L_1$ and the inductance of secondary side coil 124 is $L_2$. Flyback 110 also includes primary side switch 118 (Q1) controlled by a control signal, Vgate 116. Switch 118 is configured to control the current through primary side coil 122. In the example of FIG. 1, the drain of switch 118 is coupled, i.e. electrically connected, to primary side coil 122 at a node. The voltage of the node is Vdrain 120.

Diode 123 provides rectification of output voltage Vout 130. Capacitor C 126 may provide power smoothing and conditioning for Vout 130 and output current Iout 132. In the example of system 100, Vout 130 connects to voltage regulator 106 which further conditions the output voltage and current before the power reaches load 146 as Vload 140 and Iload 142. In some examples voltage regulator 106 may be considered part of an output circuit, which may include diode 123 and C 126, which is operatively coupled to secondary side coil 124. The output circuit is configured to condition output power (Vout 130 and Iout 132) from the isolated power converter circuit, flyback 110. In some examples, a power converter with flyback topology may include other circuit functions, such as an RCD snubber (not shown in FIG. 1).

System 100 also includes voltage sensing circuit 150. In some examples voltage sensing circuit 150 includes a trigger detection unit (not shown in FIG. 1) configured to detect a change in level of control signal Vgate 116 from flyback control circuitry 112. In other examples, sensing circuit 150 may be configured to detect a rising edge of Vdrain 120. Flyback control circuitry 112 may output control signal Vgate 116 to primary side switch 118 and the change in level of the control signal may be synchronized to a power cycle of the power converter. The trigger detection circuit may output a detection signal approximately simultaneous with the change in level of control signal Vgate 116. The detection signal may be approximately simultaneous, and the timing may be impacted by physical characteristics of the trigger detection circuit, e.g. processing time, latency based on circuit layout, temperature and other factors. Voltage sensing circuit 150 may also include a delay unit (not shown in FIG. 1) configured to receive the detection signal from the trigger detection unit and output a trigger signal to the voltage sampling unit after a predetermined time delay. In the example of system 100, the voltage sensing circuit is configured to take one and only one voltage measurement sample for each detection signal.

Voltage sensing circuit 150 may also include a voltage sampling unit (not shown in FIG. 1) operatively coupled to primary side coil 122 of flyback 110. The voltage sampling unit may be configured to measure a voltage of the primary side coil, e.g. Vdrain 120, upon receiving the trigger signal.

The example of system 100 includes communication interface 104, which may be configured to receive signals and send commands to the components of system 100. For example, communication interface 104 may command load controller circuit 108 to change the speed of a motor, in an example in which load 146 is an electric motor. In other examples, communication interface 104 may command load controller circuit 108 to change the level of lighting, in the example in which load 146 is lighting. Communication interface 104 may also receive signals such as the power output to load 146, e.g. the magnitude of Vload 140 and/or Iload 142 from voltage regulator 106. Communication interface 104 may also receive signals and send commands to other components such as output voltage sensing circuit 150 and flyback controller circuit 112. In the example of a vehicle, communication interface 104 may send and receive signals to other portions of a larger system, such as via a controller area network (CAN) or local interconnect network (LIN) communication link.

In operation, output voltage sensing circuit 150 (Vout sensing circuit 150), may determine a first off-transition time of control signal Vgate 116 from flyback controller circuit 112 to primary side switch 118. In this disclosure, the "off-transition" refers to the effect of the control signal on switch 118. Therefore, an off-transition time is the time the control signal Vgate 116 transitions to cause switch 118 to switch off the current through the primary side coil. An on-transition time is the time the control signal Vgate 116 transitions to cause switch 118 to switch on the current through the primary side coil. For example, for an enhancement-type switch, the off-transition for control signal Vgate 116 may transition from high to low to turn off the current through switch 118. For a depletion-type switch, the off-transition for control signal Vgate 116 may transition from low to high in order to turn off the current through switch 118, and therefore the off-transition may be a rising edge.

In some examples, physical characteristics of switch 118 may cause a delay between the off-transition time of control signal Vgate 118 and a switch-off time for the switch 118, where the switch-off time of switch 118 is a time when the current through switch 118, and through primary coil 122, begins to turn off. The delay between the off-transition time and switch-off time for the switch 118 may be known based on the selection of the type, manufacturer, capacity and other characteristics of switch 118.

Vout sensing circuit 150 may also include a predetermined time delay between determining a first off-transition time of control signal Vgate 116 and outputting a sample trigger signal. The predetermined time delay may begin from the first off-transition time and delay the sample trigger signal for enough time so that the node voltage, Vdrain 120, may stabilize. After the predetermined time delay, Vout sensing circuit 150 may be configured to trigger a voltage measurement circuit within Vout sensing circuit 150 (not shown in FIG. 1) to measure the magnitude of the voltage, Vdrain 120 at the node on the primary side of the power converter for a predetermined sampling time. As shown in FIG. 1, the node is located between the drain of switch 118 and primary side coil 122. In system 100, Vout sensing circuit 150 measures Vdrain 120 via Vdrain sense line 134.

Vout sensing circuit 150 may also be configured to inhibit the voltage measurement circuit from taking further voltage measurements until a second off-transition time of control signal Vgate 116. In the example of FIG. 1 the second off-transition time is subsequent to the first off-transition time. In other words, the voltage sensing circuit is configured to take one and only one voltage measurement sample for each detection signal in response to an off-transition of control signal Vgate 116 coupled to switch 118.

Vout sensing circuit 150 may also be configured to calculate the magnitude of output voltage Vout 130 at a secondary side coil 124 of flyback 110 based on the measured voltage at the node. Flyback controller circuitry 112 may receive the calculated, i.e. estimated, output voltage Vout 130 from Vout sensing circuit 150, via Vout-est line 114. Flyback controller circuitry 112 may further adjust the operation of flyback 110, e.g. by adjusting control signal Vgate 116. In other words, flyback controller circuitry 112 may control the operation of the isolated power converter circuit, i.e. system 100, based on a magnitude of voltage from the output circuit Vout 130.

In some examples, flyback 110 may operate in a voltage mode control, a current mode control, skipping mode, and so on. In some examples, flyback 110 may operate in continuous conduction mode (CCM) or in discontinuous conduction modes (DCM). CCM and DCM refer to whether the current in the energy storage element (i.e. inductor L1, also called primary side coil 122) goes to zero for each switching cycle. In some examples, flyback controller circuitry 112 may operate flyback 110 in CCM mode during a higher load demand and automatically switch to DCM mode for lower load demand. In other words, power cycle of the power converter may depend on the load demand.

System 100 is an example of an isolated feedback network for a power converter with flyback topology, that may have the advantage over other power converters because system 100 may determine the output voltage Vout 130 without using an optocoupler or other types of isolation components, nor an auxiliary winding on the transformer.

Figures 2A, 2B:
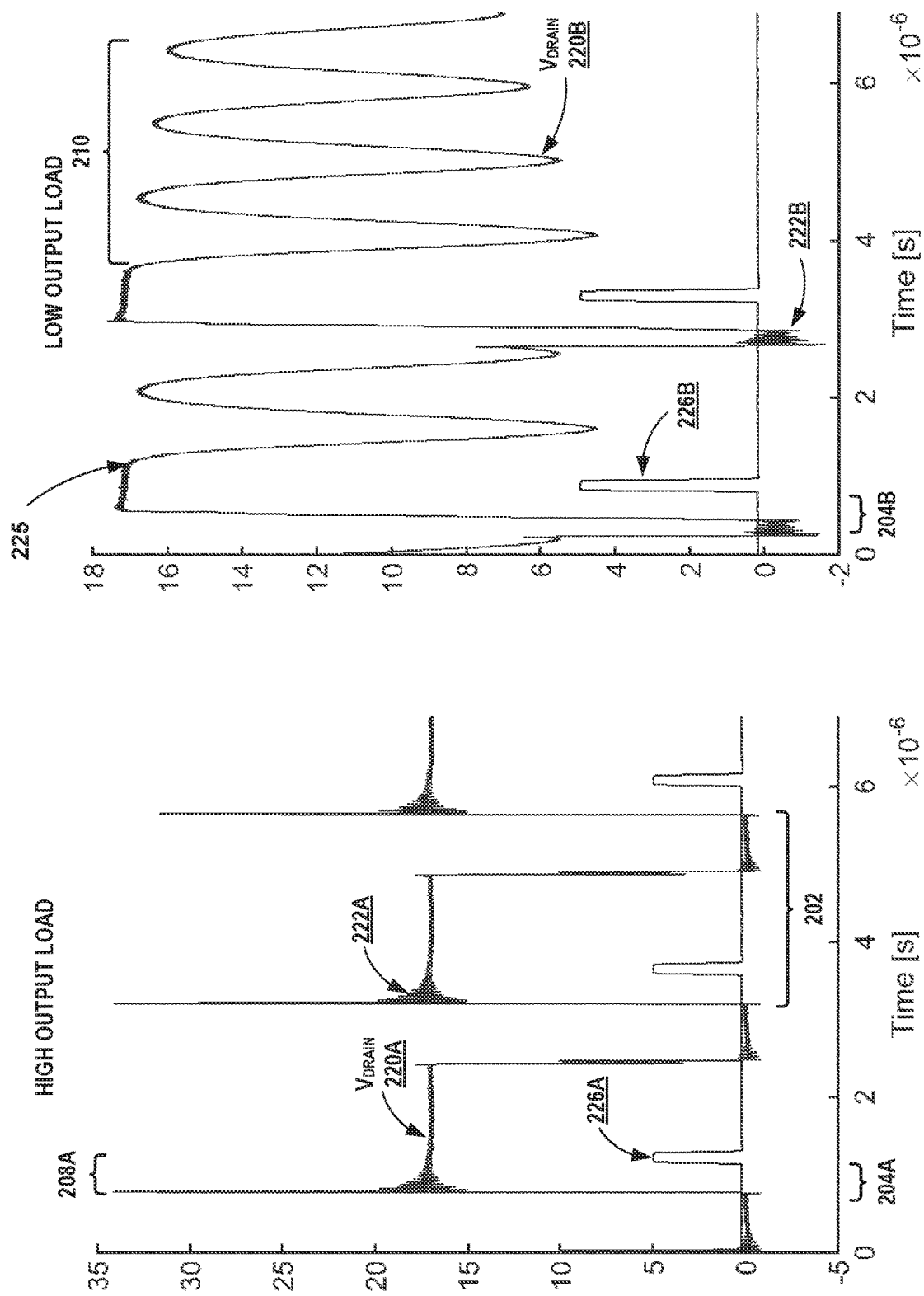
FIG. 2A is a timing diagram illustrating a CCM mode of operation of an example output voltage sensing circuit according to one or more techniques of this disclosure.
FIG. 2B is a timing diagram illustrating a DCM mode of operation of an example output voltage sensing circuit according to one or more techniques of this disclosure.

FIG. 2A is a timing diagram illustrating a CCM mode of operation of an example output voltage sensing circuit according to one or more techniques of this disclosure. The timing diagram of FIG. 2A illustrates the operation of flyback 110 and Vout sensing circuit 150, described above in relation to FIG. 1 with a high output load. Vout sensing circuit 150 measures the signal obtained on the drain of the primary side switch during the switch off-phase to retrieve the output voltage information, e.g. Vdrain 120 describe above in relation to FIG. 1. Unless otherwise noted, components and signals in the descriptions of FIGS. 2A and 2B refer to components and signals from FIG. 1.

For each switching cycle 202 of flyback 110, control signal Vgate 116 (not shown in FIG. 2A) causes switch 118 to switch off the current to primary side coil 122. The energy remaining in the primary side coil 122 causes Vdrain 120 to increase and develop leakage ringing 222A. The off-transition time of control signal Vgate 116 serves as a first start point for predetermined delay 204A as the drain voltage rises with the turn off of switch 118. Predetermined delay 204A is configured to wait for rise of drain voltage signal, Vdrain signal 220A, and subsequent ringing 222A caused by the coil leakage to settle to a negligible magnitude. The length of predetermined delay time 204A depends on the characteristics of the flyback power converter. In other words, characteristics such as parasitic capacitance and magnetic energy left in primary side coil 122 which may cause leakage ringing. In some examples predetermined delay time 204A may be on the order of 100 ns.

In this disclosure the amount of time from a switch-off time of the primary side switch to the time at which the ringing, e.g. 222A of Vdrain signal 220A, settles to a negligible magnitude will be referred to as a leakage ringing time 208A. At the end of leakage ringing time 208A, Vdrain signal 220A may still include a leakage component, which may cause some ringing, but the effect may be considered negligible for purposes of the techniques of this disclosure. The predetermined time delay may be configured to be longer than the leakage ringing time to provide an accurate measurement of the magnitude of Vdrain signal 220A.

The sample trigger signal, described above in relation to FIG. 1, may cause Vout sensing circuit 150 to sample and hold the magnitude of Vdrain signal 220A. In some examples the leading edge of pulse 226A may act as the sample trigger signal. In some examples the pulse width of pulse 226A may determine the sampling time for sampling the magnitude of Vdrain signal 220A. In other examples, the falling edge of pulse 226A, or some other point on pulse 226A may act as the sample trigger signal and/or the start of the hold period. The Vout sensing circuit may hold the sampled value until the next sample trigger signal.

FIG. 2B is a timing diagram illustrating a DCM mode of operation of an example output voltage sensing circuit according to one or more techniques of this disclosure. The timing diagram of FIG. 2B illustrates the operation of flyback 110 and Vout sensing circuit 150, described above in relation to FIG. 1 with a low output load. As with the CCM example FIG. 2A above, FIG. 2B depicts a single sample event synchronized to the control signal off-transition causing the primary side switch off-transition (and hence to the drain voltage signal 220B low to high transition).

As with the FIG. 2A, in some examples, the sample event, depicted by pulse 226B, may be delayed for predetermined time delay 204B with respect the control signal off-transition time. In other examples, the predetermined time delay 204B (or 204A) may be started with respect to the switching time of the primary side switch. As described above in relation to FIG. 1, the switching time may have a delay with respect to the off-transition time because of physical characteristics of the primary side switch, circuit layout and other factors. In some examples, the output voltage sensing circuit may determine the switching time by monitoring Vdrain signal 220B rather than control signal Vgate 116.

As described above in relation to FIG. 2A, predetermined delay 204B is configured to wait for effect of drain voltage signal, Vdrain signal 220B, and subsequent ringing 222B caused by the coil leakage to settle to a negligible magnitude. Sampling Vdrain signal 220B after the predetermined delay 204B may provide a more accurate determination of the reflected output voltage on the primary side winding. In some examples, a sum of the predetermined time delay plus the predetermined sampling time is less than a time at which a boundary point 225 occurs. The boundary point is found in DCM mode and it occurs at the point before the DCM oscillations 210 occur. In other words, the time at which the boundary point occurs is subsequent to the first switching time and prior to the second switching time. Said another way the time at which the boundary point occurs is subsequent to a first off-transition time and prior to the second off-transition time for the next switching cycle.

In the example of FIG. 2B, the operation of the power converter circuit with low output load may cause the flyback controller circuitry 112 to operate in skipping mode. Because the output voltage sensing circuit of this disclosure only generates a sample trigger pulse on the off-transition of the control signal Vgate 116 voltage, this skipping event does not lead to problems and the voltage sensing circuit may continue to provide the flyback controller circuit with an estimate of the output voltage.

The diode voltage drop of rectifier diode 123 depicted in FIG. 1, may have a significant temperature and current dependency and therefore may influence the estimated output voltage. The only point in the cycle where the influence of the secondary side rectifier diode is zero is at the boundary point 225. However, implementing a precise detection circuit for the boundary point would not work if the converter is operating in CCM because there is no boundary point in CCM. Therefore, one advantage the techniques of this disclosure is deriving the output voltage information independent of the operating mode.

Figure 3:
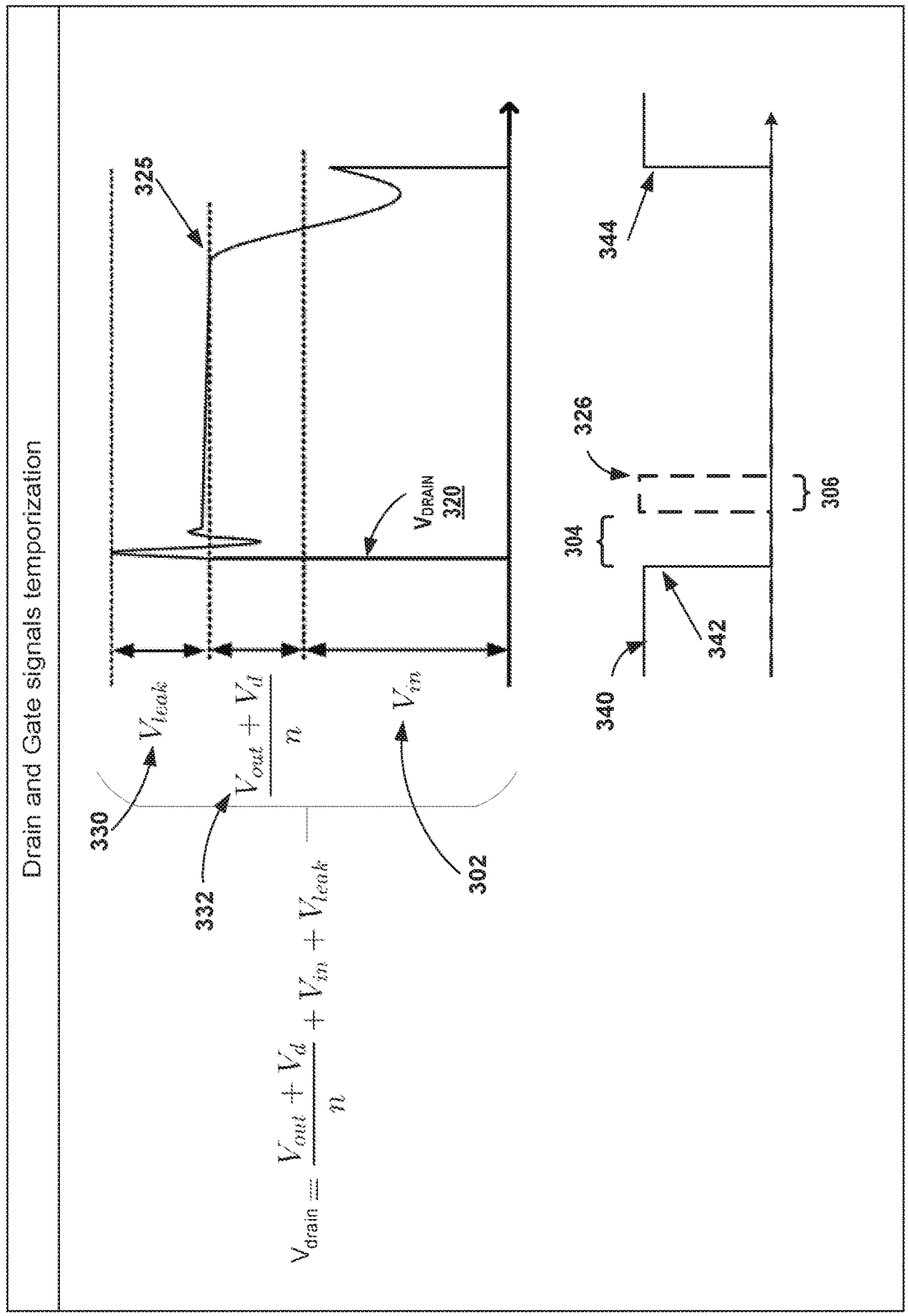
FIG. 3 is a timing diagram illustrating the operation of an example output voltage sensing circuit according to one or more techniques of this disclosure.

FIG. 3 is a timing diagram illustrating the operation of an example output voltage sensing circuit according to one or more techniques of this disclosure. The example of FIG. 3 depicts details of calculating the estimated output voltage on the secondary side by measuring values on the primary side. The Vout sensing circuit may determine the estimated output voltage using sampled voltage magnitude information of the Vdrain signal (e.g. Vdrain signals 220A and 220B described above in relation to FIGS. 2A and 2B) according to the following formula:

$$V_{drain} = \frac{V_{out} + V_d}{n} + V_{in} + V_{leak}$$

The timing diagram of FIG. 3 illustrates the leakage voltage, Vleak 330, which results from energy remaining in the primary side coil, causing Vdrain signal 320 to increase and develop leakage ringing, as described above in relation to FIGS. 1-2B. The contribution to the Vdrain signal 320 from the input voltage Vin is shown at 302. Vin 302 corresponds to Vin 102 depicted in FIG. 1. The contribution to the Vdrain signal 320 from the reflected output voltage and reflected diode voltage drop (Vd) are shown as divided by the transformer turns-ratio, n, is according to (332):

$$\frac{V_{out} + V_d}{n}$$

The result of the processed information output by the output voltage sensing circuit is the output voltage Vout plus the diode drop Vd (Vout+Vd). Vout+Vd corresponds to the signal sent from Vout sensing circuit 150 to flyback controller circuit 112 via Vout-est line 114, as described above in relation to FIG. 1. Therefore:

$$V_{OUT\text{-}EST} = V_{out} + V_d = n(V_{drain} - V_{in} - V_{leak})$$

For the two operating modes CCM and DCM, the equations above describe the drain voltage during the primary side switch off phase, before the DCM oscillation occur. The techniques of this disclosure derive the output voltage information by subtracting the input voltage, Vin 302, filter the high frequency oscillations of Vleak 330 and the transformer turns ratio, n. By waiting until after the predetermined time delay 304, which is configured to be greater than the leakage ringing time, e.g. leakage ringing time 208A described above in relation to FIG. 2A, then Vleak 330 may be considered negligible for purposes of the techniques of this disclosure. In some examples, the Vdrain sense line 134, depicted in FIG. 1, may include a low pass filter (LPF) to further reduce the effect of Vleak 330.

Further, the systematic error from the diode drop (Vd) is not a disadvantage, even though Vd may have a significant temperature and current dependency, as described above in relation to FIG. 2B. In pre-regulation applications the precision of the regulated voltage is not a key factor, therefore Vd can be managed in the output voltage calculation. In other words, the precision of the pre-regulated output voltage, e.g. Vout 130, is not a key factor when compared to the regulated output voltage Vload 140, as depicted above in FIG. 1.

FIG. 3 also depicts other details of the operation of an example output voltage sensing circuit. The control signal 340 include an off-transition 342 and an on-transition 344. In the example of FIG. 3, the off-transition 342 is a falling edge and the on-transition 344 is a rising edge. However, as described above in relation to FIG. 1, control signal 340 may also be inverted from that depicted in FIG. 3, depending on the choices of circuit components, such as switch 118.

The output voltage sensing circuit may detect the off-transition of control signal 340. After the predetermined time delay 304 output voltage sensing circuit may send a sample trigger signal, such as pulse 326. In some examples the leading edge of pulse 326 is the trigger signal. The trigger signal may cause triggering a voltage measurement circuit of the output voltage sensing circuit to measure the magnitude of voltage at the drain node on the primary side of the power converter for a predetermined sampling time. In some examples, pulse width 306 of pulse 326 may be the sampling time. In other examples, the sampling time may be set by a separate input, or by some other technique. As described above in relation to FIG. 2B, the sum of predetermined delay 304 and sampling time 306 is configured to be less than a time at which boundary point 325 occurs for DCM. A boundary point does not occur for CCM.

Figure 4A:
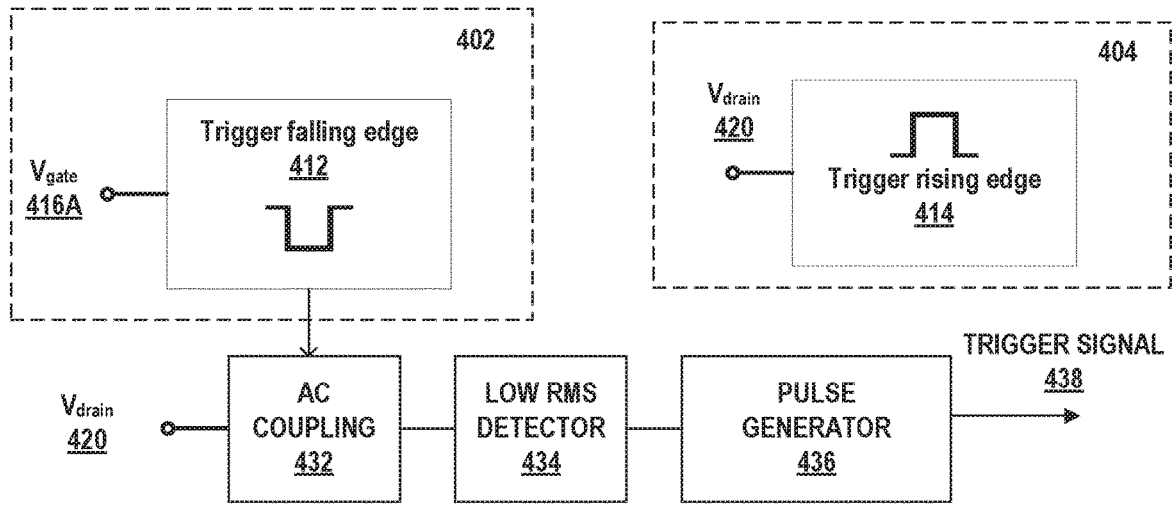
FIGS. 4A and 4B are block diagrams illustrating example techniques to determine the start time of Vdrain sampling.
Figure 4B:
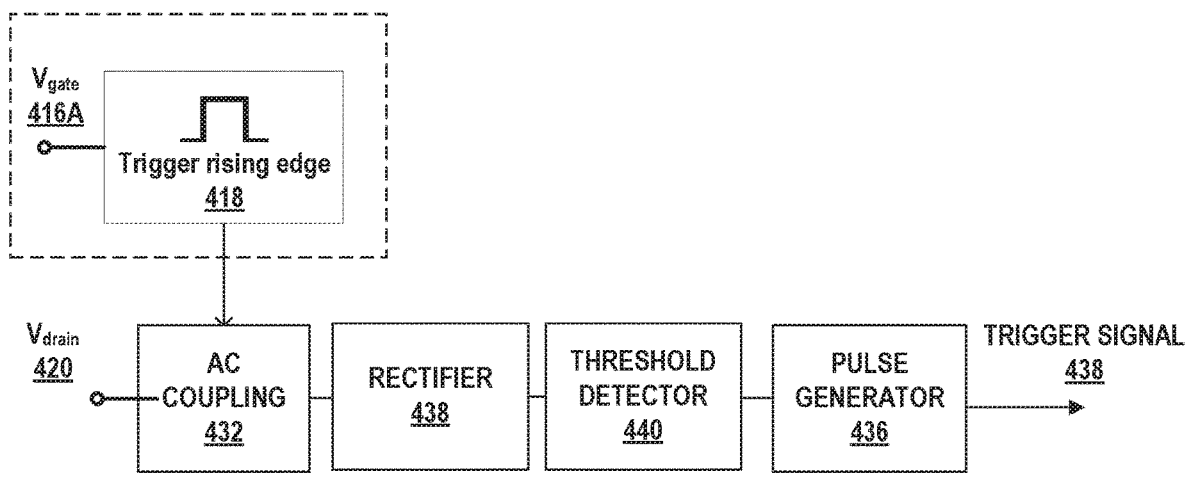

FIGS. 4A and 4B are block diagrams illustrating example techniques to determine the start time of Vdrain sampling. The example of FIG. 4A illustrates a system that may output signals similar to the timing diagram example of FIG. 3. Falling edge detection circuit 412 receives control signal, Vgate 416A, which corresponds to control signal Vgate 116 described above in relation to FIG. 1. Falling edge detection circuit 412 may output a detection signal approximately simultaneous with the change in level of control signal Vgate 416A to AC coupling 432. The detection signal may enable AC coupling 432 to receive Vdrain signal 420, e.g. from node Vdrain 120 described above in relation to FIG. 1. AC coupling 432 may include components that allow an AC signal to pass, such as a capacitor. In other examples block 402, which triggers on the falling edge of Vgate 416A, may be replaced with block 404, which may trigger on the rising edge of Vdrain 420 using rising edge detection circuit 414. As described above in relation to FIG. 1, the timing of the rising edge of Vdrain 420 may be delayed when compared to the timing of the falling edge of control signal Vgate 416A.

The output from AC coupling 432 may be received by low root mean square (RMS) detector 434. RMS detector 434 may determine whether the leakage ringing time has run. In other words, RMS detector 434 may determine whether the contribution to Vdrain from Vleak has settled enough to be negligible, as discussed above in relation to FIG. 2A. Once Vleak has settled, pulse generator 436 may output trigger signal 438 to cause a voltage measurement of the magnitude of the Vdrain circuit after a predetermined delay. Trigger signal 438 may be similar to pulse 326 described above in relation to FIG. 3 and pulses 226A and 226B described above in relation to FIGS. 2A and 2B.

The example of FIG. 4B operates similar to the example of FIG. 4A, with the exception that the off-transition of control signal Vgate 416A is a rising edge. Rising edge detection circuit 418 may output a detection signal approximately simultaneous with the change in level of control signal Vgate 416A. The function of Vdrain 420, AC coupling 432, pulse generator 436 and trigger signal 438 are the same as described above in relation to FIG. 4A. The example of FIG. 4B also includes rectifier circuit 438 and threshold detector 440 placed between AC coupling 432 and pulse generator 436.

Figure 5:
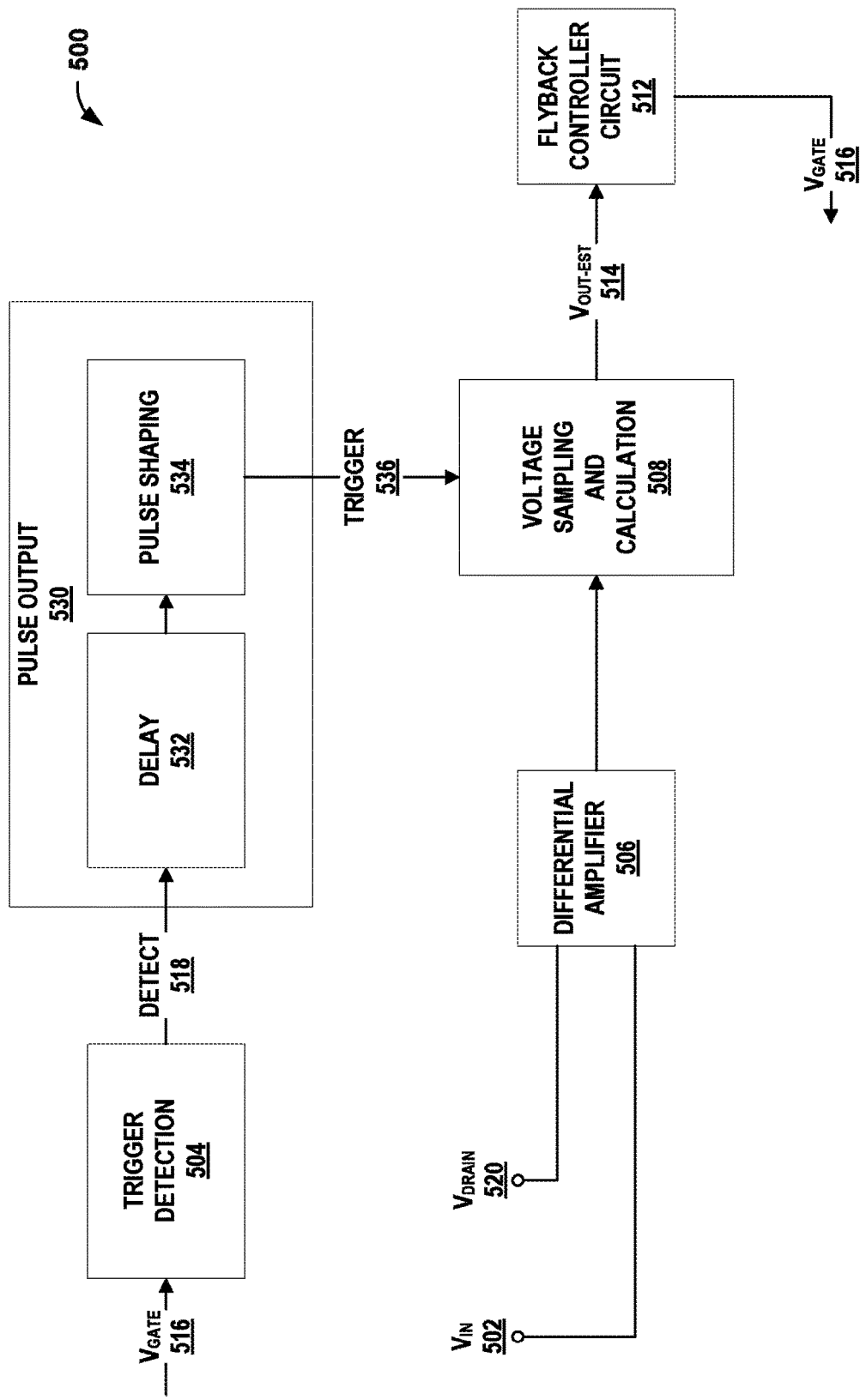
FIG. 5 is a block diagram illustrating an example output voltage sensing circuit with pulse shaping for a power converter according to one or more techniques of this disclosure.

FIG. 5 is a block diagram illustrating an example output voltage sensing circuit with pulse shaping for a power converter according to one or more techniques of this disclosure. System 500 is an example of a Vout sensing circuit as described above in relation to FIGS. 1-4B, such as Vout sensing circuit 150 depicted in FIG. 1. Examples of the units and circuitry of system 500 may be implemented in a variety of hardware circuitry including discrete components, an integrated circuit, in software instructions executed by a processor or some combination of hardware and/or software. In this disclosure, the terms circuit and circuitry may include logic circuits, circuit boards, processing circuitry, computer readable storage, discrete components, integrated circuits and other hardware implementations.

System 500 includes trigger detection circuitry 504, pulse output circuitry 530, a differential amplifier 506, voltage sampling and calculation circuitry 508, and flyback controller circuit 512. Signals in system 500 include control signal Vgate 516, input voltage Vin 502 and the measured voltage signal from Vdrain 520. Flyback controller circuit 512, control signal Vgate 516, Vin 502, Vout-est 514 and Vdrain 520 are examples of flyback controller circuit 112, control signal Vgate 116, Vin 102, Vout-est 114 and Vdrain 120 described above in relation to FIG. 1, as well as similar components described in relation to FIGS. 2A-4B.

Trigger detection circuitry 504, also referred to as trigger detection unit 504, may monitor control signal Vgate 516, which is sent from flyback controller 512 to a primary side switch, e.g. switch 118 as described above in relation to FIG. 1. Trigger detection unit 504 is configured to detect a change in level of control signal Vgate 516 and output a detection signal 518 approximately simultaneous with the change in level of the control signal. Trigger detection unit 504 may detect a rising edge or a falling edge of the off-transition of control signal Vgate 516, as described above in relation to FIGS. 4A and 4B.

Pulse output circuit 530 may receive detection signal 518 at approximately the off-transition time of control signal Vgate 516. As described above, in relation to FIG. 1, in some examples, physical characteristics of the trigger detection circuit, e.g. latency based on circuit layout and other factors may cause pulse output circuit 530 to receive detection signal 518 approximately simultaneous to the off-transition time. In the example of system 500, pulse output circuit 530 includes delay unit 532 and pulse shaping unit 534.

Delay unit 532 may be configured to receive detection signal 518 from trigger detection unit 504 and output trigger signal 536 to the voltage sampling unit after a predetermined time delay. In some examples, pulse output circuit 530 may also perform pulse shaping on trigger signal 536 before outputting trigger signal 536 to the voltage sampling unit, which is voltage sampling and calculation circuitry 508 in the example of system 500. As described above in relation to FIG. 3, in some examples the pulse width of the trigger signal may set the predetermined sampling time. Pulse width may be set by pulse shaping unit 534.

Voltage sampling and calculation circuitry 508 is operatively coupled to a primary side coil of an isolated power converter circuit, such as flyback 110 depicted in FIG. 1, through differential amplifier 506. Differential amplifier 506 connects to the node between the primary side coil and drain of the primary side switch to monitor the node voltage Vdrain 520. Differential amplifier 506 also receives Vin 502 from the input voltage of the primary side and is configured to subtract Vin 502 from Vdrain 520, as described above in relation to FIG. 3. Voltage sampling and calculation circuitry 508 is configured to measure the resultant output from differential amplifier 506 for a predetermined sampling time, after receiving trigger signal 536. In other words, Voltage sampling and calculation circuitry 508 is configured to measure a voltage of the primary side coil upon receiving trigger signal 536.

The voltage sensing circuit depicted by system 500 is configured to take one and only one voltage measurement sample of Vdrain 520 for each detection signal 518. As discussed above in relation to FIG. 2B, system 500 may have an advantage over other techniques, such as techniques that determine a boundary point before taking a voltage sample, because system 500 may function when the power converter is in either CCM or DCM, including when the power converter is skipping during DCM. System 500 may implement the one and only one measurement in any one of the functional blocks, e.g. delay unit 532 or voltage sampling and calculation circuitry 508.

As described above in relation to FIG. 3, voltage sampling and calculation circuitry 508 may determine the estimated pre-regulated output voltage on the secondary side of the power converter. Voltage sampling and calculation circuitry 508 may further output the estimated output voltage as Vout-est 514 to flyback controller circuit 512. Flyback controller circuit 512 may adjust the operation of the power converter, e.g. by adjusting control signal Vgate 516.

Figure 6:
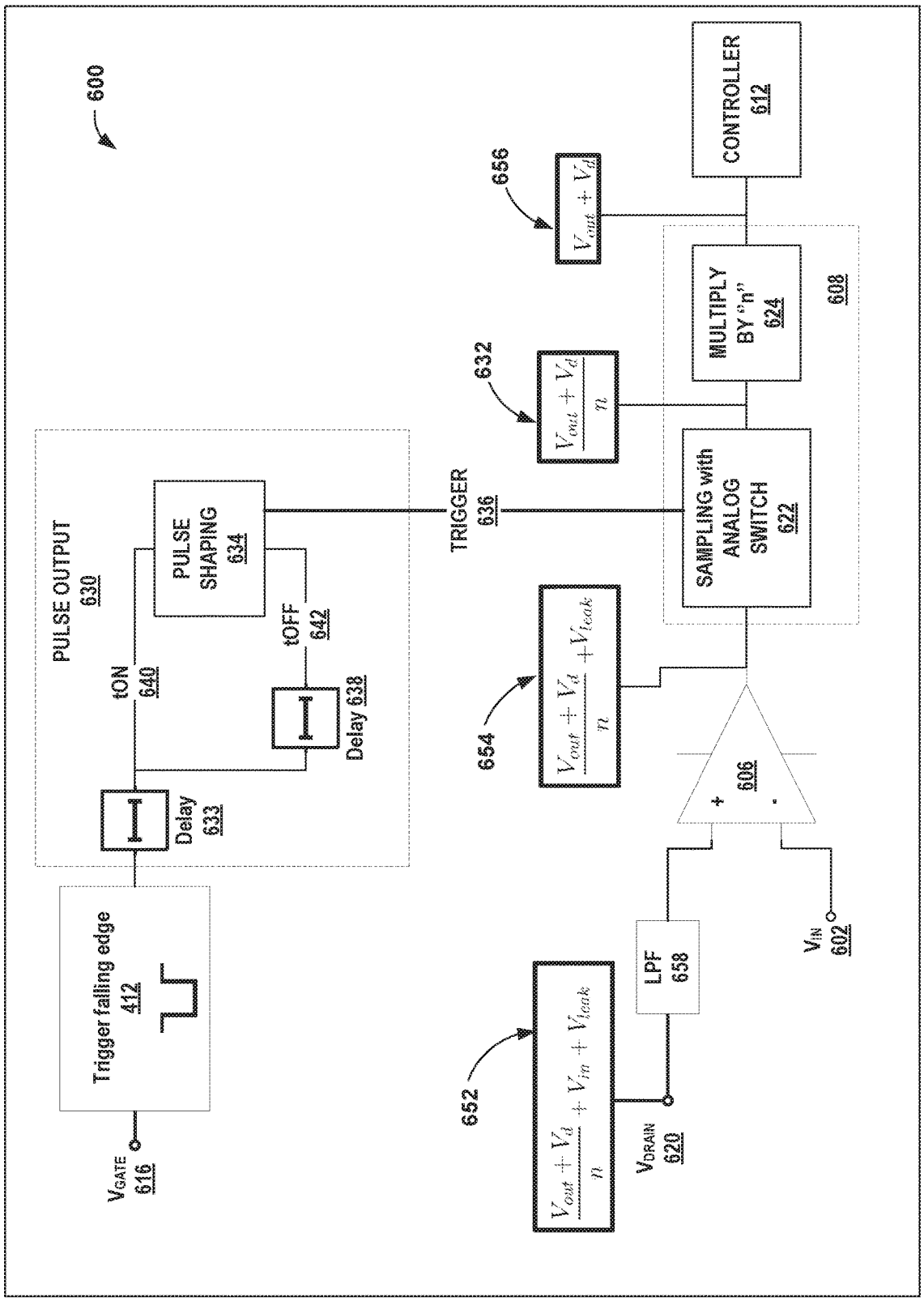
FIG. 6 is a schematic and block diagram illustrating an example output voltage sensing circuit with pulse shaping for a power converter according to one or more techniques of this disclosure.

FIG. 6 is a schematic and block diagram illustrating an example output voltage sensing circuit with pulse shaping for a power converter according to one or more techniques of this disclosure. System 600 is an example of a Vout sensing circuit as described above in relation to FIGS. 1-5.

System 600 includes, falling edge detection circuit 412, pulse output circuitry 630, a differential amplifier 606, voltage sampling and calculation circuitry 608, and flyback controller circuit 612. Signals in system 600 include control signal Vgate 616, input voltage Vin 602 and the measured voltage signal from Vdrain 620. Controller circuit 612, control signal Vgate 616, Vin 502 and Vdrain 620 are examples of flyback controller circuit 112, control signal Vgate 116, Vin 102, Vout-est 114 and Vdrain 120 described above in relation to FIG. 1, as well as similar components described in relation to FIGS. 2A-5. Falling edge detection circuit 412 has the same function and description as falling edge detection circuit 412 described above in relation to FIG. 4A.

Pulse output circuitry 630 receives a detection signal from falling edge detection circuit 412 approximately simultaneous to the off-transition of control signal Vgate 616. Delay 633 may add a predetermined time delay to set and on-time, tON 640 for trigger signal 636. As described above in relation to FIGS. 2 and 3, the predetermined time delay of tON 640 is set to wait for rise of drain voltage signal, Vdrain 620, and subsequent ringing caused by the coil leakage to settle to a negligible magnitude. In some examples, pulse shaping unit 634 use delay via delay 638 to set an off-time, tOFF 642 for trigger signal 636. In some examples, tOFF 642 sets the pulse width for trigger signal 636 and may set the predetermined sampling time for sampling circuit 622 of voltage sampling and calculation circuitry 608. The amount of delay from delay 638, and therefore tOFF 642 may be configurable and based on one or more characteristics of the isolated power converter circuit. In the example of system 600, sampling circuit 622 may use an analog switch to sample and hold the measurement from differential amplifier 606. Sampling circuit 622 may hold the sampled value until the next trigger 636.

Differential amplifier 606 receives Vin 602 from the input voltage of the primary side to the inverting input. The non-inverting input of differential amplifier 606 connects to the node between the primary side coil and drain of the primary side switch to monitor the node voltage Vdrain 620. In some examples, a low pass filter, LPF 658, may filter the signal from Vdrain 620 to reduce the contribution from the leakage ringing Vleak, as described above in relation to FIG. 3. Therefore, differential amplifier 606 is configured to subtract Vin 502 from Vdrain 520. The monitored Vdrain 620 signal is according to 652, i.e.:

$$V_{drain} = \frac{V_{out} + V_d}{n} + V_{in} + V_{leak}$$

The output from differential amplifier 606 to voltage sampling and calculation circuitry 608 is according to the value shown in 654:

$$\frac{V_{out} + V_d}{n} + V_{leak}$$

Voltage sampling and calculation circuitry 608 samples and holds the magnitude of the signal measured at Vdrain 620 as controlled by trigger signal 636. Because the trigger signal is configured to allow Vleak to settle to a negligible value, the output of sampling circuit 622, in the example of system 600 is defined by 632:

$$\frac{V_{out} + V_d}{n}$$

Voltage sampling and calculation circuitry 608 may include a calculation unit 624, which in the example of system 600 may multiply by 'n', i.e. multiply by the transformer turns ratio, the output of sampling circuit 622. In other words, calculation unit 624 may be configured to estimate the output voltage at a secondary side of the power converter (e.g. Vout 130 depicted in FIG. 1) based on the measured voltage Vdrain 620 of the primary side coil. Because differential amplifier 606 subtracts the value of Vin 602 from Vdrain 620, system 600 therefore calculates the output voltage at the secondary side Vout, based on a magnitude of an input voltage Vin 602 to the primary side coil. As described above in relation to FIG. 3, the estimated output voltage sent to controller 612 may include the diode voltage drop Vd as shown by 656: Vout+Vd.

Figure 7:
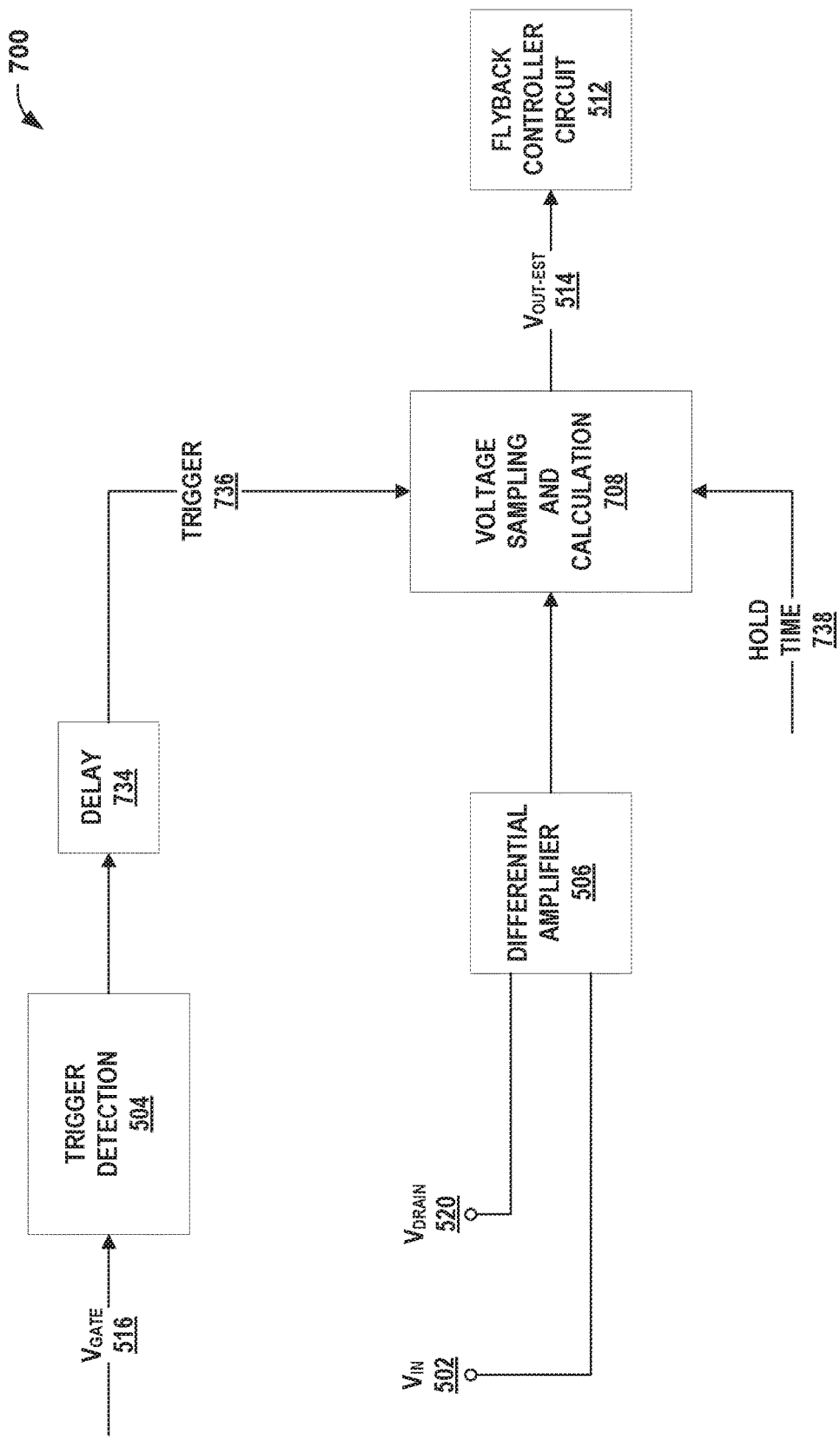
FIG. 7 is a block diagram illustrating an example output voltage sensing circuit with a separate sampling time input for a power converter according to one or more techniques of this disclosure.

FIG. 7 is a block diagram illustrating an example output voltage sensing circuit with a separate sampling time input for a power converter according to one or more techniques of this disclosure. System 700 is an example of a Vout sensing circuit as described above in relation to FIGS. 1-6, and functions nearly the same as system 500 described above in relation to FIG. 5. The difference between system 500 and system 700 is that in system 500, the pulse width of trigger 536 sets the predetermined sampling time for the sample and hold function of voltage sampling and calculation circuitry 508. In contrast, voltage sampling and calculation circuitry 708 of system 700 includes a separate sampling time input 738 to set the sampling time.

In the example of system 700, delay 734 may set the predetermined time delay for trigger signal 736 to allow the leakage ringing to settle to a negligible level. The remaining blocks and signals of system 700, i.e. trigger detection unit 504, differential amplifier 506, voltage sampling and calculation circuitry 508, flyback controller circuit 512, control signal Vgate 516, Vin 502, Vdrain 520 and Vout-est 514 have the same functions and descriptions as the same numbered components described above in relation to FIG. 5.

Figure 8A:
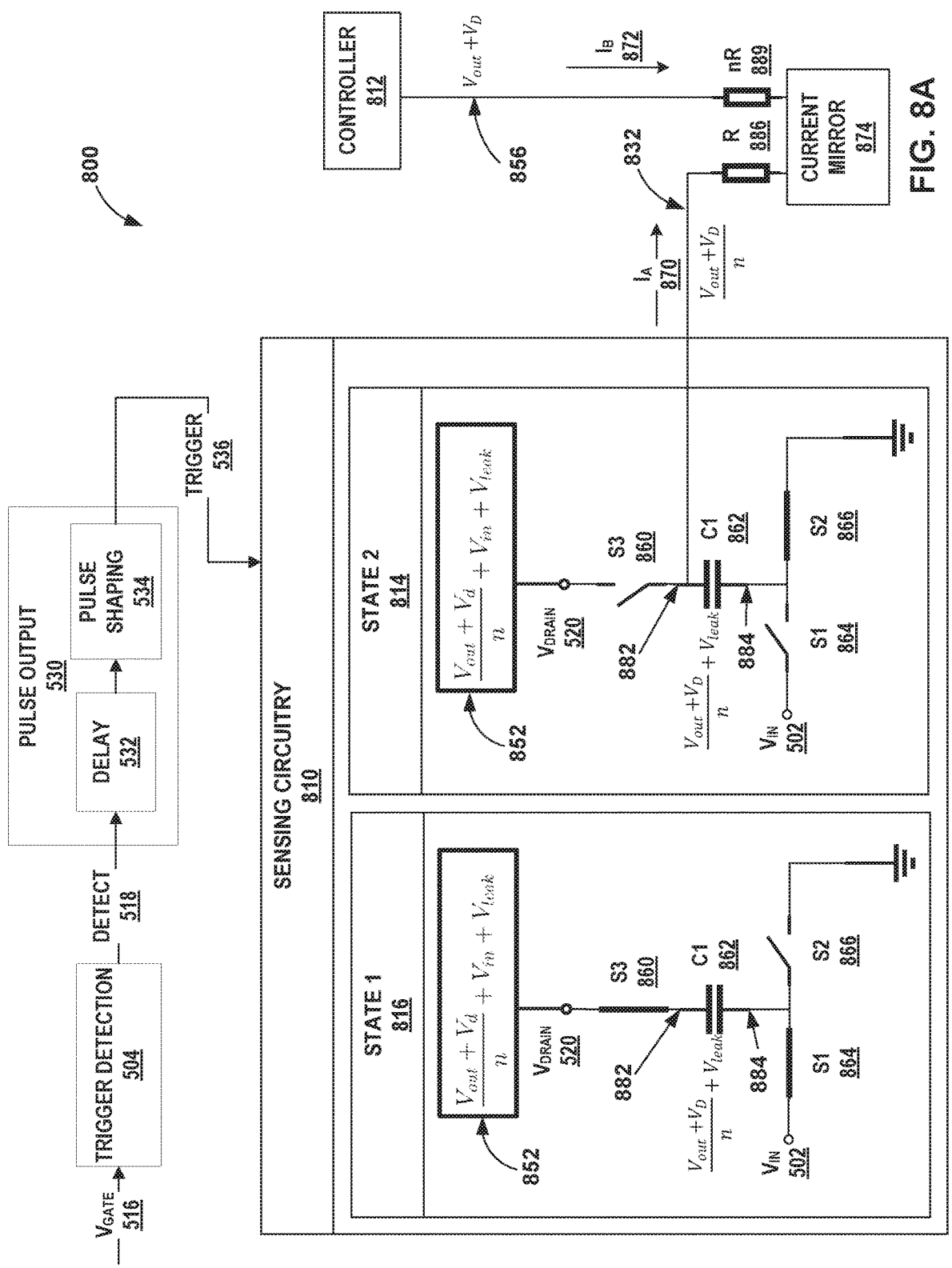
FIGS. 8A-8C are schematic and block diagrams illustrating an example output voltage sensing circuit with a multiple state input circuit according to one or more techniques of this disclosure.
Figure 8B:
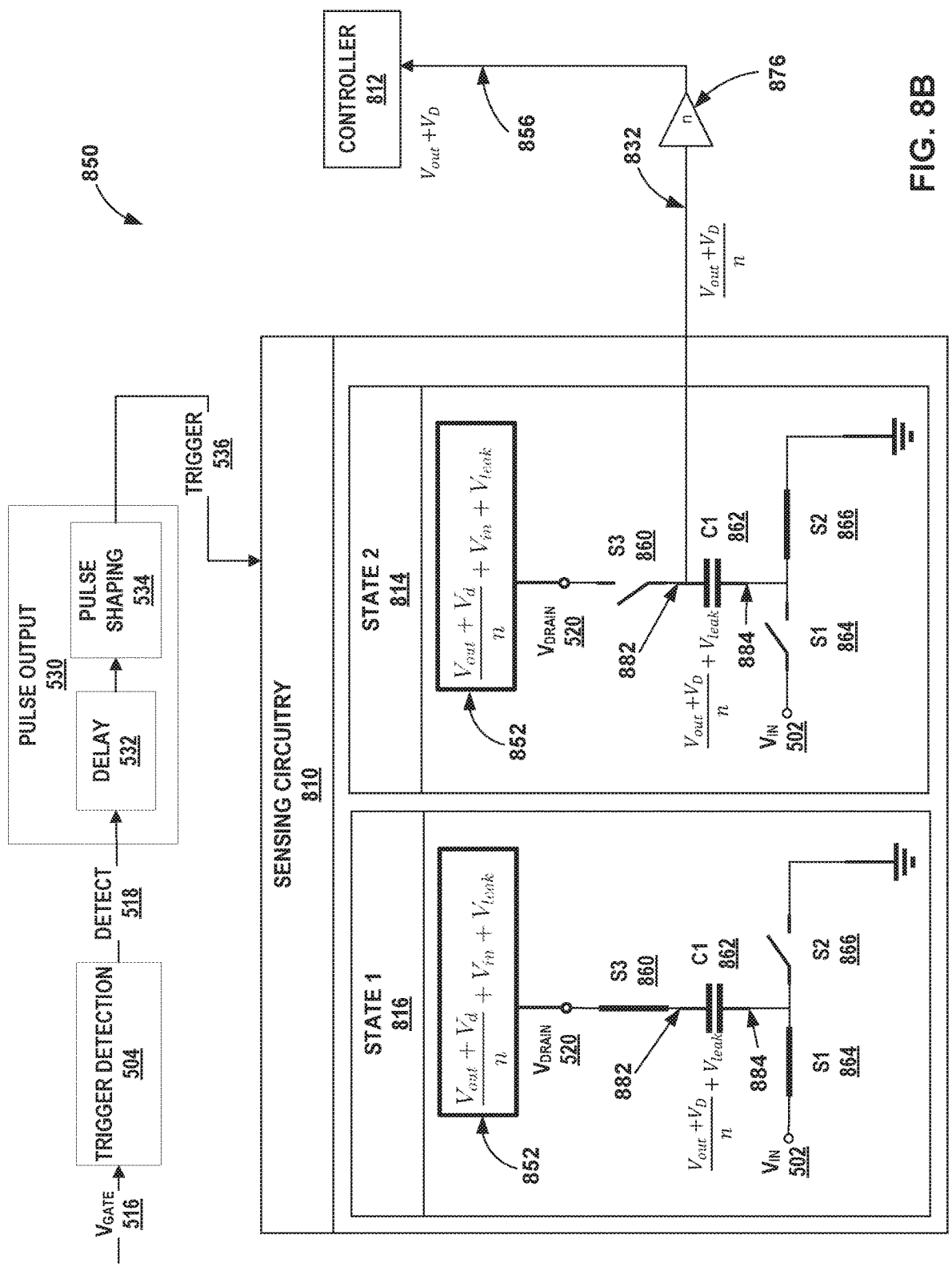
Figure 8C:
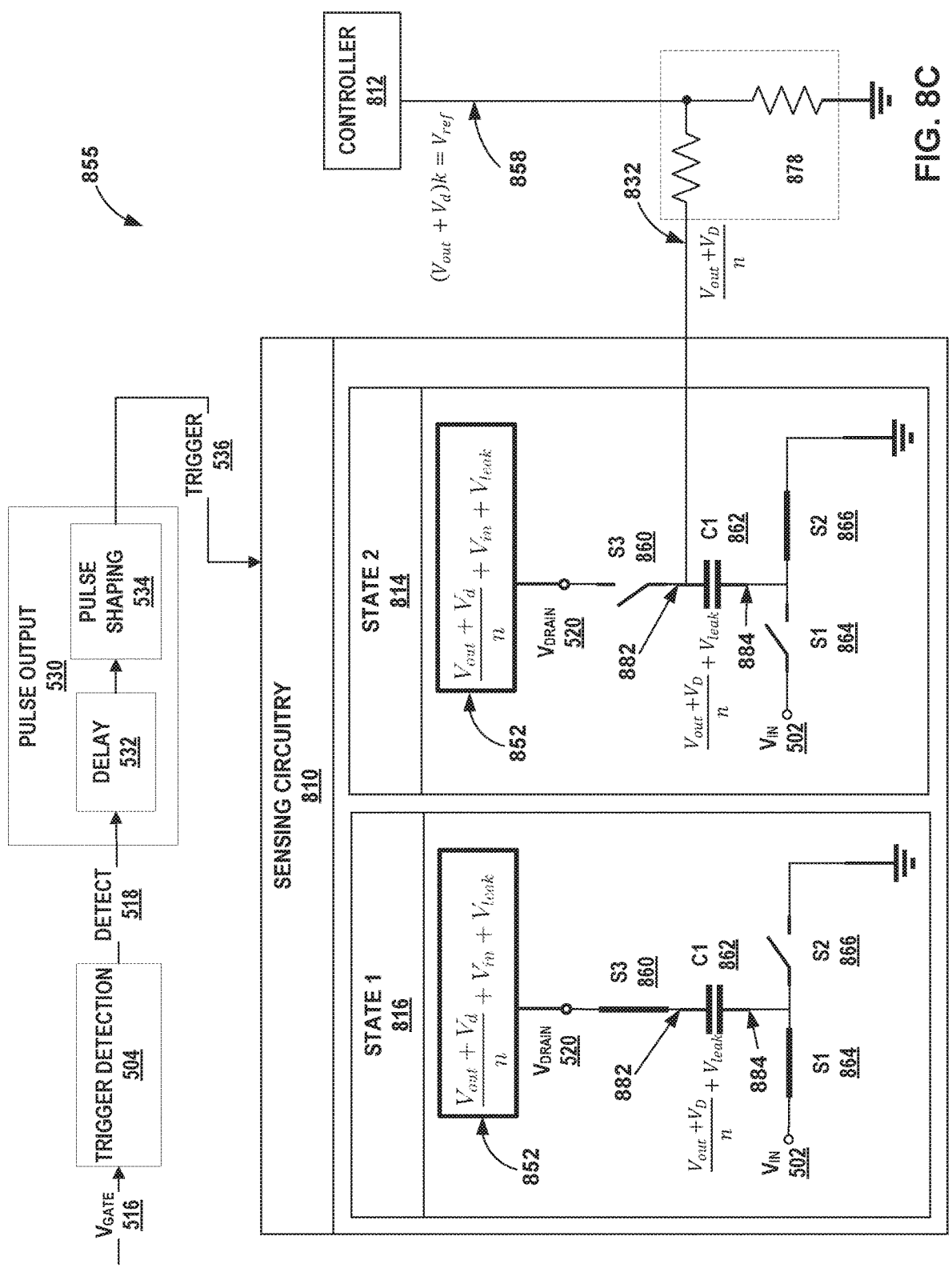

FIGS. 8A-8C are schematic and block diagrams illustrating an example output voltage sensing circuit with a multiple state input circuit according to one or more techniques of this disclosure. System 800 of FIG. 8A is an example of a Vout sensing circuit as described above in relation to FIGS. 1-3. System 800 includes the trigger detection and pulse output portions of system 500 described above in relation to FIG. 5. The trigger detection unit 504, pulse output unit 530, control signal Vgate 516, trigger signal 536, Vin 502, and Vdrain 520 have the same functions and descriptions as the same numbered items described above in relation to FIG. 5.

In the example of system 800, sensing circuitry 810 receives trigger signal 536 during the off-state of the primary side switch. This description assumes that trigger signal 536 includes a rising edge, falling edge and pulse width, similar to pulse 326 depicted in FIG. 3. In other examples, trigger signal 536 may also be implemented as a negative pulse or inverted pulse with the initial edge being a falling edge.

The rising edge of trigger signal 536 may cause sensing circuitry 810 to enter the first state 816. In the first state 816, Vdrain 520 connects to a first terminal 882 of capacitor C1 862 through switch S3 860. At the same time, the opposite terminal 884 of capacitor C1 862 connects to Vin 502 through switch S1 864. This configuration charges capacitor C1 862 to a voltage of Vdrain 520-Vin 502. As described above in relation to FIG. 6, the voltage at Vdrain 520 follows 852:

$$V_{drain} = \frac{V_{out} + V_d}{n} + V_{in} + V_{leak}$$

The falling edge of trigger signal 536 may cause sensing circuitry 810 to enter into the second state 814. In the second state, switch S3 860 opens disconnecting capacitor C1 862 from Vdrain 520. Also switch S1 864 opens disconnecting capacitor from Vin 502. The second terminal 862 of capacitor C1 862 connects to ground through switch S2 866, which makes the first terminal 882 of capacitor C1 862 equal to:

$$V_{drain} - V_{in} = \frac{V_{out} + V_d}{n} + V_{leak}$$

However, as described above in relation to FIG. 3, Vleak may be considered negligible after the predetermined time delay, i.e. after the leakage ringing time. The first terminal 882 outputs the voltage 832 on capacitor C1 862. In the example of system 800, the first terminal 882 connects to current mirror 874 through a first resistor 886 with value of R. Current mirror 874 outputs the estimated output voltage 856 (Vout+Vd) to controller 812 through a second resistor 889 with value nR. Current mirror 874 insures the input current IA 870 is the same magnitude as the output current $I_B$ 872. In this manner, system 800 calculates the output voltage at the secondary side coil based on a turns ratio 'n' between the primary side coil and a secondary side coil of the power converter as well as the magnitude of the input voltage Vin 502 to the primary side coil and the sampled voltage at the node Vdrain 520 located between the primary side switch and the primary side coil.

System 850 of FIG. 8B is a second example of a Vout sensing circuit as described above in relation to FIGS. 1-3. As with system 800, system 850 includes the trigger detection and pulse output portions of system 500 described above in relation to FIG. 5 and the sensing circuitry 810 as described above in relation to FIG. 8A. However, unlike current mirror 874 in system 800, in system 850 amplifies the output from sensing circuitry 810 with amplifier 876. Amplifier 876 is configured with a gain of 'n,' and outputs to controller 812 the estimated output voltage 856 (Vout+Vd).

System 855 of FIG. 8C is a third example of a Vout sensing circuit as described above in relation to FIGS. 1-3. As with systems 800 and 850, system 855 includes the trigger detection and pulse output portions of system 500 described above in relation to FIG. 5 and the sensing circuitry 810 as described above in relation to FIG. 8A. The output from sensing circuitry 810 in system 855 connects to resistor divider 878. The values of the resistors in resistor divider 878 are configured such that resistor divider 878 outputs the estimated output voltage 858 (Vout+Vd)k to controller 812. Controller 812 may be configured to operate based on receiving output voltage 858 (Vout+Vd)k.

Figure 9:
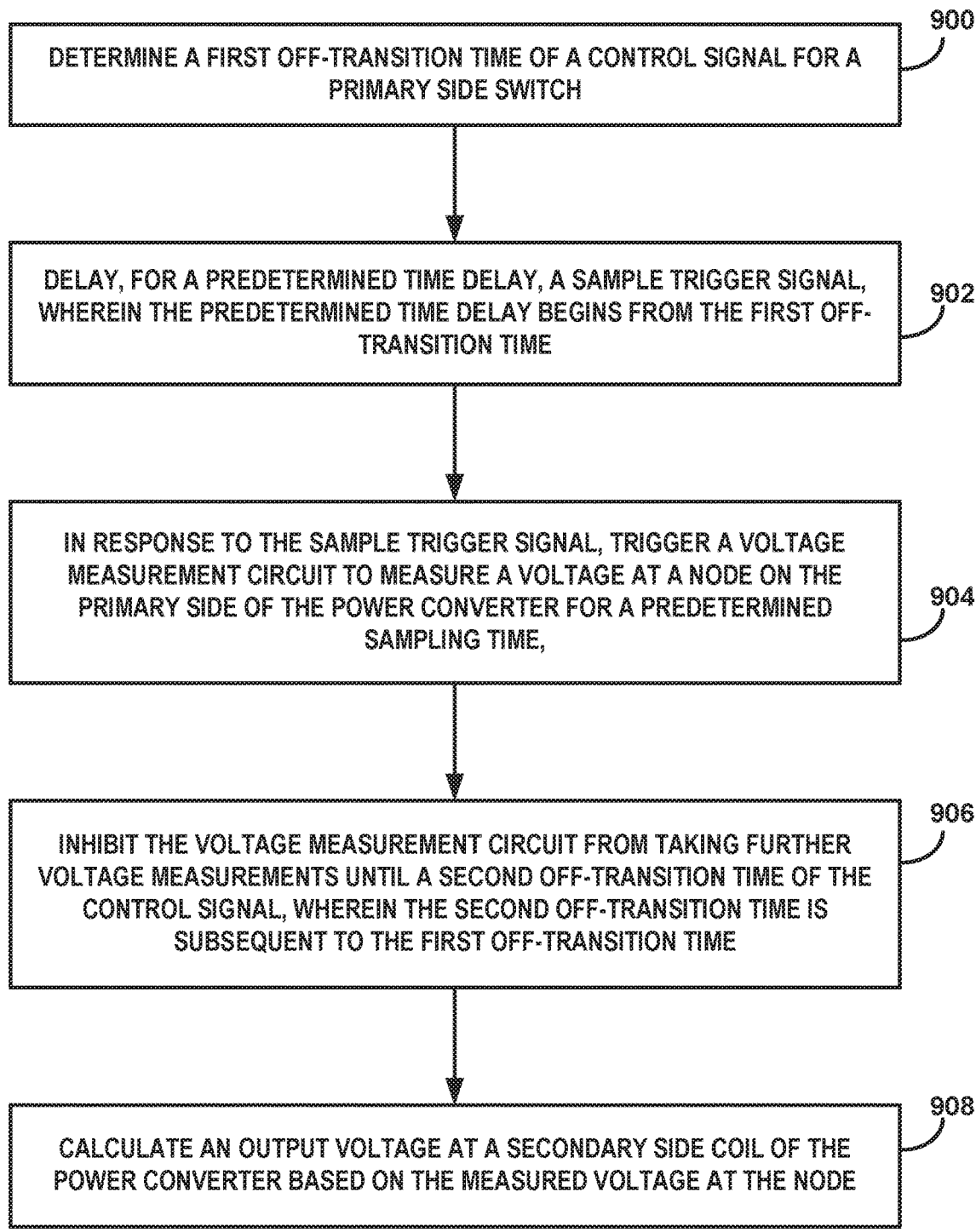
FIG. 9 is a flow diagram illustrating an example operation of an output voltage sensing circuit according to one or more techniques of this disclosure.

FIG. 9 is a flow diagram illustrating an example operation of an output voltage sensing circuit according to one or more techniques of this disclosure. The blocks of FIG. 9 will be explained in terms of FIG. 1, unless otherwise noted.

In operation, Vout sensing circuit 150, may determine a first off-transition time of control signal Vgate 116 from flyback controller circuit 112 to primary side switch 118 (900). The off-transition time is the time the control signal Vgate 116 transitions to cause switch 118 to switch off the current through the primary side coil.

Vout sensing circuit 150 may also delay the output of a sample trigger signal for a predetermined time delay that starts from the first off-transition time of control signal Vgate 116 (902). The predetermined time delay may delay the sample trigger signal for enough time so that the node voltage, Vdrain 120, may stabilize.

After the predetermined time delay, and in response to the sample trigger signal, e.g., Vout sensing circuit 150 may be configured to trigger a voltage measurement circuit to measure the magnitude of the voltage, Vdrain 120 for a predetermined sampling time (904). Examples of the sample trigger signal include trigger signal 536 depicted in FIG. 5. Examples of the voltage measurement circuit may include sampling circuit 622 depicted in FIG. 6 and sensing circuitry 810 depicted in FIG. 8.

Vout sensing circuit 150 may also be configured to inhibit the voltage measurement circuit from taking further voltage measurements until a second off-transition time of control signal Vgate 116 (906). As in the example of FIGS. 2A and 2B the second off-transition time may be subsequent to the first off-transition time. In other words, the voltage sensing circuit is configured to take one and only one voltage measurement sample for each detection signal in response to an off-transition of control signal Vgate 116 coupled to switch 118.

Vout sensing circuit 150 may also be configured to calculate the magnitude of output voltage Vout 130 at a secondary side coil 124 of flyback 110 based on the measured voltage at the node Vdrain 120 (908). Flyback controller circuitry 112 may receive the calculated output voltage Vout 130 from Vout sensing circuit 150 and may adjust the operation of flyback 110, e.g. by adjusting control signal Vgate 116.

In one or more examples, the functions described above may be implemented in hardware, software, firmware, or any combination thereof. For example, the various components of FIG. 5 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more DSPs, general purpose microprocessors, ASICs, FPGAs, or other equivalent integrated or discrete logic circuitry. Accordingly, the term "processor," as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described.

The techniques of this disclosure may also be described in the following examples.

Example 1

A method comprising: determining a first off-transition time of a control signal for a primary side switch, wherein the primary side switch controls a current through a primary side coil of a power converter, and wherein at the off-transition time, the control signal controls the primary side switch to switch off the current through the primary side coil. The method further includes delaying, for a predetermined time delay, a sample trigger signal, wherein the predetermined time delay begins from the first off-transition time. In response to the sample trigger signal, triggering a voltage measurement circuit to measure a voltage at a node on the primary side of the power converter for a predetermined sampling time, wherein the node is located between the primary side switch and the primary side coil, inhibiting the voltage measurement circuit from taking further voltage measurements until a second off-transition time of the control signal, wherein the second off-transition time is subsequent to the first off-transition time, and calculating an output voltage at a secondary side coil of the power converter based on the measured voltage at the node.

Example 2

The method of example 1, wherein the power converter is an isolated power converter with a flyback topology.

Example 3

The method of any combination of examples 1-2, further comprising calculating the output voltage at the secondary side coil based on a turns ratio between the primary side coil and a secondary side coil of the power converter.

Example 4

The method of any combination of examples 1-3, wherein the predetermined time delay is longer than a leakage ringing time, wherein the leakage ringing time begins from the first off-transition time and the second off-transition time.

Example 5

The method of any combination of examples 1-4, wherein a sum of the predetermined time delay plus the predetermined sampling time is less than a time at which a boundary point occurs, wherein the time at which the boundary point occurs is subsequent to the first off-transition time and prior to the second off-transition time.

Example 6

The method of any combination of examples 1-5, further comprising calculating the output voltage at the secondary side based on a magnitude of an input voltage to the primary side coil.

Example 7

A voltage sensing circuit, the circuit comprising: a trigger detection unit, wherein the trigger detection unit is configured to detect a change in level of a control signal and output a detection signal approximately simultaneous with the change in level of the control signal, a voltage sampling unit operatively coupled to a primary side coil of an isolated power converter circuit and configured to measure a voltage of the primary side coil upon receiving a trigger signal, and a delay unit configured to receive the detection signal from the trigger detection unit and output the trigger signal to the voltage sampling unit after a predetermined time delay, wherein the voltage sensing circuit is configured to take one and only one voltage measurement sample for each detection signal.

Example 8

The circuit of example 7, wherein the voltage sampling unit is configured to measure the voltage for a predetermined sampling time.

Example 9

The circuit of any of examples 7-8 or any combination thereof, wherein the predetermined sampling time is configurable and based on one or more characteristics of the isolated power converter circuit.

Example 10

The circuit of any combination of examples 7-9, wherein the trigger signal from the delay unit comprises a pulse, wherein a pulse width of the pulse comprises the predetermined sampling time.

Example 11

The circuit of any combination of examples 7-10, further comprising a calculation unit, wherein the calculation unit is configured to estimate an output voltage at a secondary side of the power converter based on the measured voltage of the primary side coil.

Example 12

The circuit of any combination of examples 7-11, wherein the calculation unit is further configured to estimate the output voltage based on an input voltage to the primary side coil.

Example 13

The circuit of any combination of examples 7-12, wherein the trigger detection unit is configured to detect a falling edge of the control signal.

Example 14

The circuit of any combination of examples 7-13, wherein the predetermined time delay allows a ringing in the voltage of the primary side coil to settle to a negligible magnitude.

Example 15

A system comprising: an isolated power converter circuit comprising: a transformer with a primary side coil and a secondary side coil, a primary side switch, wherein the primary side switch is controlled by a control signal, configured to control the current through the primary side coil, and coupled to the primary side coil at a node. The power converter also comprises an output circuit, wherein the output circuit is operatively coupled to the secondary side coil and configured to condition output power from the isolated power converter circuit. The system further comprises a voltage sensing circuit, the voltage sensing circuit comprising: a trigger detection unit, wherein the trigger detection unit is configured to detect a change in level of the control signal and output a detection signal approximately simultaneous with the change in level of the control signal, a voltage sampling unit operatively coupled to the node and configured to measure a voltage of the node upon receiving a trigger signal, and a delay unit configured to receive the detection signal from the trigger detection unit and output the trigger signal to the voltage sampling unit after a predetermined time delay, wherein the voltage sensing circuit is configured to take one and only one voltage measurement sample for each detection signal.

Example 16

The system of example 15, further comprising controller circuitry configured to control the operation of the isolated power converter circuit based on a magnitude of voltage from the output circuit.

Example 17

The system of any combination of examples 15-16, wherein the voltage sensing circuit is configured to estimate the magnitude of voltage from the output circuit based on the voltage measurement sample; and send the estimated magnitude of voltage to the controller circuitry.

Example 18

The system of any combination of examples 15-17, wherein the controller circuitry outputs the control signal to the primary side switch and the change in level of the control signal is synchronized to a power cycle of the power converter.

Example 19

The system of any combination of examples 15-18, wherein the trigger detection unit is configured to detect a falling edge of the control signal.

Example 20

The system of any combination of examples 15-19, wherein the predetermined time delay allows a ringing in the voltage of the primary side coil to settle to a negligible magnitude.

Various examples of the disclosure have been described. These and other examples are within the scope of the following claims.

The invention claimed is:
1. A method comprising:
determining a first off-transition time of a control signal for a primary side switch, wherein the primary side switch controls a current through a primary side coil of a power converter, and wherein at the first off-transition time, the control signal controls the primary side switch to switch off the current through the primary side coil
delaying, for a predetermined time delay, a sample trigger signal, wherein the predetermined time delay begins from the first off-transition time;
in response to the sample trigger signal, triggering a voltage measurement circuit to measure a voltage at a node on the primary side of the power converter during a predetermined sampling time, wherein the node is located between the primary side switch and the primary side coil;
inhibiting the voltage measurement circuit from taking further voltage measurements until a second off-transition time of the control signal, wherein the second off-transition time is subsequent to the first off-transition time; and
calculating an output voltage at a secondary side coil of the power converter based on the measured voltage at the node while the power converter operates in continuous conduction mode (CCM) at a first time and in discontinuous conduction modes (DCM) mode at a second time different from the first time.

2. The method of claim 1, wherein the power converter is an isolated power converter with a flyback topology.

3. The method of claim 1,
further comprising calculating the output voltage at the secondary side coil based on a turns ratio between the primary side coil and a secondary side coil of the power converter, and wherein characteristics of the isolated power converter circuit comprise parasitic capacitance and magnetic energy of the primary side coil.

4. The method of claim 3, wherein the predetermined time delay is longer than a leakage ringing time,
    wherein the leakage ringing time begins from the first off-transition time and the second off-transition time, and
    wherein the leakage ringing time is based on the characteristics of the isolated power converter circuit.

5. The method of claim 1, wherein a sum of the length of the predetermined time delay plus length of the predetermined sampling time is less than a time at which a boundary point occurs, wherein the time at which the boundary point occurs is subsequent to the first off-transition time and prior to the second off-transition time.

6. The method of claim 1, further comprising calculating the output voltage at the secondary side based on a magnitude of an input voltage to the primary side coil.

7. A voltage sensing circuit, the circuit comprising:
    a trigger detection unit, wherein the trigger detection unit is configured to detect a change in level of a control signal and output a detection signal approximately simultaneous with the change in level of the control signal;
    a voltage sampling unit operatively coupled to a primary side coil of an isolated power converter circuit and configured to measure a voltage of the primary side coil upon receiving a trigger signal while the circuit operates in continuous conduction mode (CCM) at a first time and in discontinuous conduction modes (DCM) mode at a second time different from the first time; and
    circuitry configured to:
        receive a signal comprising a leakage voltage from the primary side coil and delay the trigger signal until the leakage voltage has settled to a negligible value, and
        output the trigger signal to the voltage sampling unit, wherein the voltage sensing circuit is configured to sample the voltage of the node during one and only one predetermined sampling time for each detection signal.

8. The circuit of claim 7, wherein a length of the predetermined sampling time is configurable and based on one or more characteristics of the isolated power converter circuit.

9. The circuit of claim 8, wherein the trigger signal from the delay unit comprises a pulse, wherein a pulse width of the pulse comprises the length of the predetermined sampling time.

10. The circuit of claim 7, further comprising a calculation unit, wherein the calculation unit is configured to estimate an output voltage at a secondary side of the power converter based on the measured voltage of the primary side coil.

11. The circuit of claim 10, wherein the calculation unit is further configured to estimate the output voltage based on an input voltage to the primary side coil.

12. The circuit of claim 7, wherein the trigger detection unit is configured to detect a falling edge of the control signal.

13. A system comprising:
    an isolated power converter circuit comprising:
        a transformer with a primary side coil and a secondary side coil;
        a primary side switch, wherein the primary side switch is:
            controlled by a control signal;
            configured to control a current through the primary side coil; and
            coupled to the primary side coil at a node;
        an output circuit, wherein the output circuit is operatively coupled to the secondary side coil and configured to condition output power from the isolated power converter circuit; and
    a voltage sensing circuit, the voltage sensing circuit comprising:
        a trigger detection unit, wherein the trigger detection unit is configured to detect a change in level of the control signal and output a detection signal approximately simultaneous with the change in level of the control signal;
        a voltage sampling unit operatively coupled to the node and configured to measure a voltage of the node upon receiving a trigger signal; and
        a delay unit configured to receive the detection signal from the trigger detection unit and output the trigger signal to the voltage sampling unit after a predetermined time delay,
            wherein the voltage sensing circuit is configured to sample the voltage of the node during one and only one voltage sampling time for each detection signal while the isolated power converter operates in continuous conduction mode (CCM) at a first time and in discontinuous conduction modes (DCM) mode at a second time different from the first time.

14. The system of claim 13, further comprising controller circuitry configured to control an operation of the isolated power converter circuit based on a magnitude of voltage from the output circuit.

15. The system of claim 14, wherein the voltage sensing circuit is configured to:
    estimate the magnitude of voltage from the output circuit based on the voltage measurement sample; and
    send the estimated magnitude of voltage to the controller circuitry.

16. The system of claim 14, wherein the controller circuitry outputs the control signal to the primary side switch and the change in level of the control signal is synchronized to a power cycle of the isolated power converter circuit.

17. The system of claim 13, wherein the trigger detection unit is configured to detect a falling edge of the control signal.

18. The system of claim 13, wherein the predetermined time delay allows a ringing in the voltage of the primary side coil to settle to a negligible magnitude.

19. The circuit of claim 7, further comprising an AC coupling operatively coupled between the primary side coil and the circuitry configured to receive the signal comprising the leakage voltage,
    wherein the detection unit outputs the detection signal to the AC coupling approximately simultaneous with the change in level of the control signal, and
    wherein the detection circuit causes the AC coupling to couple the signal comprising the leakage voltage from the primary side coil to the circuitry configured to receive the signal comprising the leakage voltage.

20. The circuit of claim 19, wherein the AC coupling comprises a capacitor.

21. The circuit of claim 19, wherein the AC coupling comprises a switch.

22. The circuit of claim 19, wherein the circuitry further comprises an RMS detector coupled to the AC coupling, wherein RMS detector is configured to determine whether the leakage voltage has settled to a negligible level.

23. The circuit of claim 19, wherein the circuitry further comprises a threshold detector coupled to the AC coupling.

* * * * *